United States Patent [19]

Yabe

[11] Patent Number: 5,405,804
[45] Date of Patent: Apr. 11, 1995

[54] METHOD OF MANUFACTURING A SEMICONDUCTOR DEVICE BY LASER ANNEALING A METAL LAYER THROUGH AN INSULATOR

[75] Inventor: Kazunari Yabe, Kanagawa, Japan

[73] Assignee: Kabushiki Kaisha Toshiba, Kawasaki, Japan

[21] Appl. No.: 184,850

[22] Filed: Jan. 21, 1994

[30] Foreign Application Priority Data

Jan. 22, 1993 [JP] Japan ............................... 5-008715
Jan. 21, 1994 [JP] Japan ............................... 6-004958

[51] Int. Cl.6 ..................... H01L 21/26; H01L 21/268; H01L 21/42
[52] U.S. Cl. .................................... 437/773; 437/193; 437/194; 437/922; 437/923; 219/121.6; 219/121.65
[58] Field of Search ........................ 437/173, 922, 923; 219/121.6, 121.65; 117/904

[56] References Cited

U.S. PATENT DOCUMENTS

| 4,375,993 | 3/1983 | Mori et al. | 148/1.5 |
| 4,549,064 | 10/1985 | Delfino | 219/121 LM |
| 4,617,723 | 10/1986 | Mukai | 29/576 B |
| 4,674,176 | 6/1987 | Tuckerman | 437/173 |
| 4,873,413 | 10/1989 | Vesugi et al. | 219/121.68 |
| 5,306,651 | 4/1994 | Masumo et al. | 437/40 |

Primary Examiner—Brian E. Hearn
Assistant Examiner—Lynne A. Gurley
Attorney, Agent, or Firm—Michael N. Meller

[57] ABSTRACT

A method of manufacturing a semiconductor device in which a first insulation layer is formed on a semiconductor substrate and a metal wiring layer is formed on part of the first insulation layer and a polycrystalline silicon layer on another part thereof. A second insulation layer is formed over at least the metal wiring layer and is irradiated with a laser beam of low energy density to anneal the metal wiring layer.

14 Claims, 6 Drawing Sheets

METHOD OF MANUFACTURING A SEMICONDUCTOR DEVICE BY LASER ANNEALING A METAL LAYER THROUGH AN INSULATOR

FIELD OF THE INVENTION

The present invention relates to a method for manufacturing a semiconductor device and more particularly, to a method of manufacturing a semiconductor device having a laser annealed metal wiring layer and to a semiconductor MOS device formed by such method.

BACKGROUND OF THE INVENTION

Figure 1A:
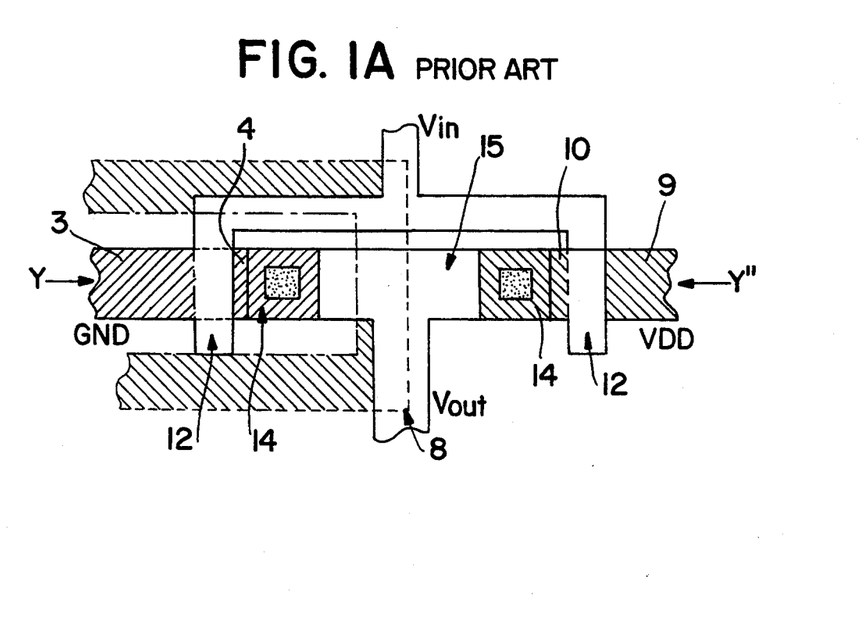
FIG. 1A is an upper surface view of a CMOS inverter for explaining a manufacturing method of a conventional semiconductor device.
Figure 1B:
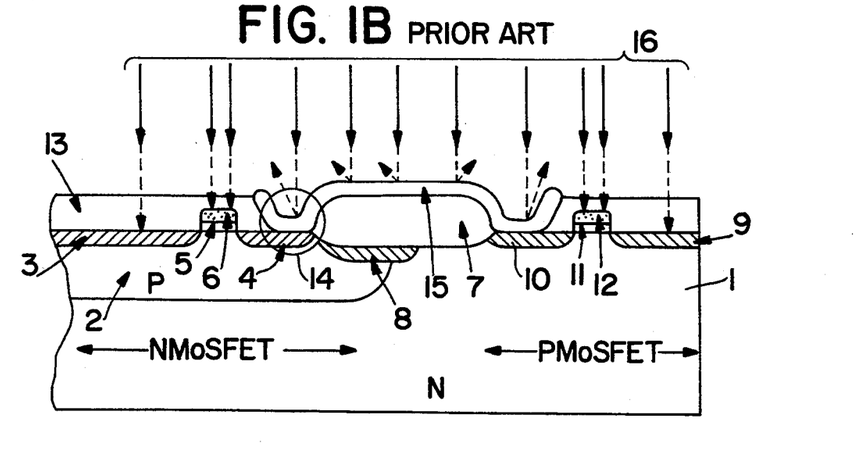
FIG. 1B is a cross sectional view taken along the line of Y—Y" of FIG. 1A.
Figure 2:
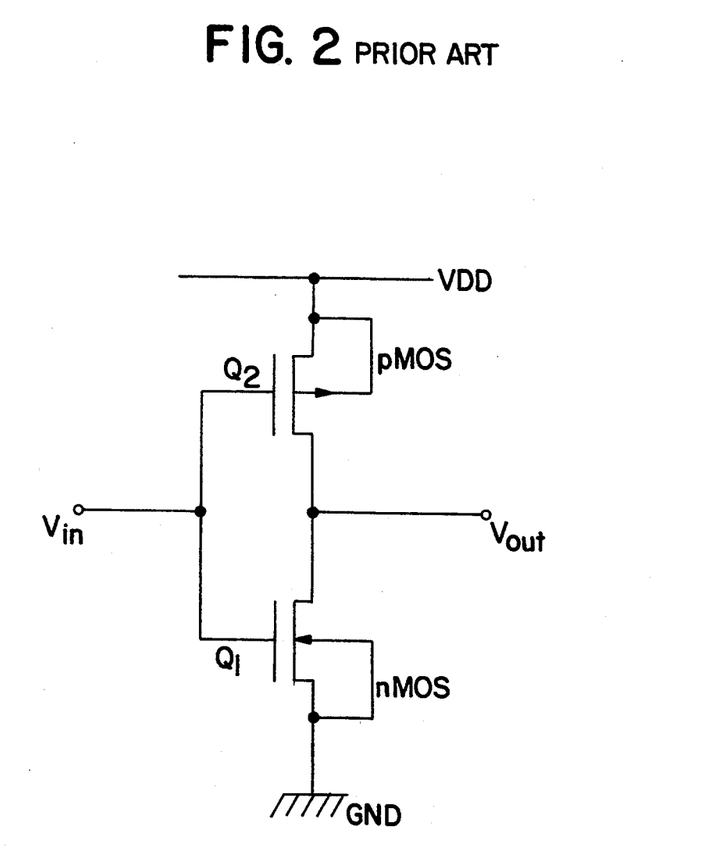
FIG. 2 is a view of an equivalent circuit of the CMOS inverter.

A typical semiconductor CMOS (complementary metal oxide semiconductor) inverter, as is conventionally known is shown in FIGS. 1A and 1B. FIG. 1B is a cross sectional view of FIG. 1A and FIG. 2 shows an equivalent circuit of the CMOS inverter of FIGS. 1A and 1B.

As is well known, the CMOS inverter comprises an N MOSFET (metal oxide semiconductor field effect transistor) and P MOSFET.

Referring to prior art FIGS. 1A and 1B, the structure of an N MOSFET is shown including a P type well region 2 formed on an N type semiconductor substrate 1. A source region 3 and a drain region 4 are formed in the P type well region 2. The source region 3 and the drain region 4 are N+ type impurity diffusion regions. Moreover, a gate insulation film 5 and a gate electrode 6, which is formed of polycrystalline silicon, are formed on the semiconductor substrate 1.

Next the structure of the P MOSFET will be explained.

The P MOSFET is formed in the N type semiconductor substrate 1. The P MOSFET is isolated from the N MOSFET by a field oxide film 7 and an isolation region 8. A source region 9 and a drain region 10 are formed in the semiconductor substrate 1. The source region 9 and the drain region 10 are P+ type impurity diffusion regions. Moreover, a gate insulation film 11 and a gate electrode 12, which is formed of polycrystalline silicon, are formed on the semiconductor substrate 1. Gate electrode 12 may be interconnected to gate electrode 6 of FIG. 1B. Furthermore, the N MOSFET and P MOSFET are coated with a silicon oxide film 13. A contact hole 14 is formed by removing a portion of the silicon oxide film 13. The drain regions 4 and 10 are electrically connected to a metallic wiring layer 15 preferably of aluminum at the contact hole 14.

Copper or silicon may be added to the aluminum wiring layer 15. Since the atomic radius of copper is large, the copper has a technical advantage in which electromigration of the aluminum wiring layer 15 can be prevented. Also, at a contact portion between the semiconductor substrate 1 and the aluminum wiring layer 15, the silicon is used to control the diffusion of silicon of the semiconductor substrate 1 into the aluminum wiring layer 15 and to prevent the shape of the surface of the contact portion from being changed. Following conventional practice, the aluminum wiring layer 15 to which copper or silicon may be added is then annealed. If the aluminum wiring layer 15 is annealed so that the diameter of crystal grain becomes larger, resistance to electromigration is improved. As a result, the life time of the aluminum wiring layer 15 is prolonged.

In recent years, as shown in FIG. 1B, such an annealing process using a laser beam has been tried. According to such method, the laser beam 16 is directly irradiated onto the aluminum wiring layer 15 which is heated up to close to 660° C., which is the melting point of aluminum. Thereafter, if the aluminum wiring layer is recrystallized, the diameter of crystal grain becomes large. This increases the life time of the aluminum wiring layer 15.

However, aluminum reflects most of the energy of the laser beam. Actually, 90% or more of the energy density (J/cm$^2$) of the laser beam 16 is reflected from the surface of the aluminum wiring layer 15 at the time of annealing. Since energy density of the laser beam 16 corresponds to quantity of heat, 90% or more of the entire quantity of heat of the laser beam is lost. As a result, to provide for sufficient annealing, the energy density of the laser beam must be increased to a level substantially above 0.5 J/cm$^2$ and up to about 0.7 (J/cm$^2$).

As apparent from FIG. 1B, the laser beam 16 is also being irradiated onto the silicon oxide film 13, which is not coated with the aluminum wiring layer 15. As a result of such high density radiation from the laser beam, the gate electrodes 6 and 12, which are formed of polycrystalline silicon, are unfavorably influenced. If the energy density of the laser beam is high enough, the gate electrodes 6 and 12, may completely melt and disappear. Even if not melted, reliability of the gate electrodes 6 and 12 is reduced, and in the worst case, the electrical connection is broken.

As mentioned above, although the aluminum wiring layer can be fully annealed by a laser beam having a high energy density, this exerts an unfavorable influence on the gate electrodes formed of polycrystalline silicon. Conversely, the aluminum wiring layer 15 cannot be fully annealed by a laser beam having low energy density.

SUMMARY OF THE INVENTION

In accordance with the method of the present invention, the aluminum wiring layer in a semiconductor device can be fully annealed without exerting an unfavorable influence on a semiconductor electrode which is formed of polycrystalline silicon.

The present invention relates to a method for manufacturing a semiconductor device and more particularly, to a method for annealing a semiconductor device having a metal wiring layer using a laser beam of low energy density. For purposes of the present invention, low energy density means a density of less than about 0.5 J/cm$^2$. In practicing the preferred embodiment of the present invention, first, a layer, which is formed of polycrystalline silicon, followed by a wiring layer, which is formed of aluminum, are formed on a semiconductor substrate. Next, the wiring layer is coated with a second insulation layer. Then, the wiring layer is annealed by irradiating a laser beam having a low energy density upon the second insulation layer.

The laser beam to be used at the time of annealing should preferably have a short wavelength and an energy density from 0.3 to 0.5 (J/cm$^2$).

DETAILED DESCRIPTION OF THE RELATED EMBODIMENTS

A first embodiment of the present invention will be explained with reference to FIGS. 3 to 5.

Figure 3:
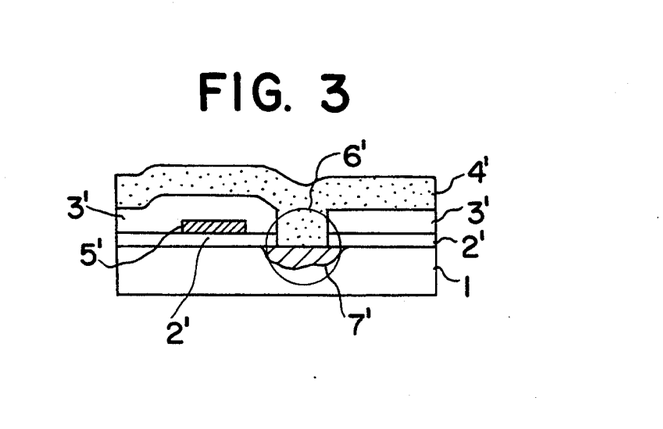
FIG. 3 is a diagrammatic cross sectional view of a semiconductor device for explaining an embodiment of the present invention.

FIG. 3 is a cross sectional view of a semiconductor device in which an aluminum wiring layer is formed before the annealing process is performed. First, a silicon oxide film $2'$ is formed on a semiconductor substrate 1 by thermal oxidation. Sequentially, a polycrystalline silicon film is formed on the silicon oxide film $2'$ by CVD (chemical vapor deposition). Thereafter, a mask is formed on the polycrystalline silicon film, and the polycrystalline silicon film is etched preferably by dry etching to form the polycrystalline silicon wiring layer $5'$. Next, a first silicon oxide film $3'$ is formed on the entire surface of the semiconductor substrate 1. The polycrystalline silicon wiring layer $5'$ is coated with the first silicon oxide film $3'$. Sequentially, the silicon oxide films $2'$ and $3'$ are dry-etched and a contact hole $6'$ is formed through which a part of the semiconductor substrate 1 is exposed.

Thereafter and in sequence, an aluminum wiring layer $4'$ is formed on the entire surface of the first silicon oxide film $3'$ by sputtering. By use of a mask, the aluminum wiring layer $4'$ is etched so as to form a predetermined wiring pattern. The aluminum wiring layer $4'$ is electrically connected to an impurity diffusion layer $7'$ through contact hole $6'$.

Figure 4:
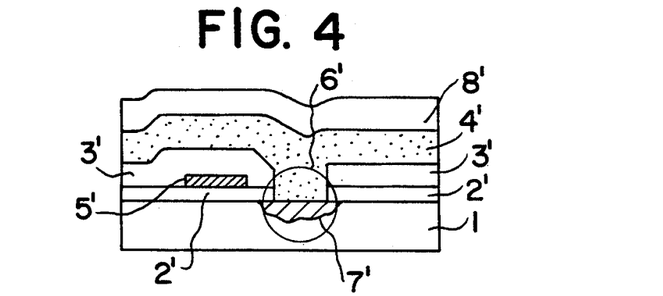
FIG. 4 is a diagrammatic cross sectional view of the semiconductor of FIG. 3 with the second insulation film shown thereon.

FIG. 4 is a cross sectional view of a semiconductor device in which a second insulation film $8'$ is formed on the aluminum wiring layer $4'$ before an annealing process is performed. The second silicon insulation film $8'$ is formed on the entire surface by CVD. According to one embodiment of the present invention as will be hereafter further explained in detail, the thickness of the second silicon insulation film $8'$ should correspond to an integral multiple of the laser beam wavelength.

Figure 5:
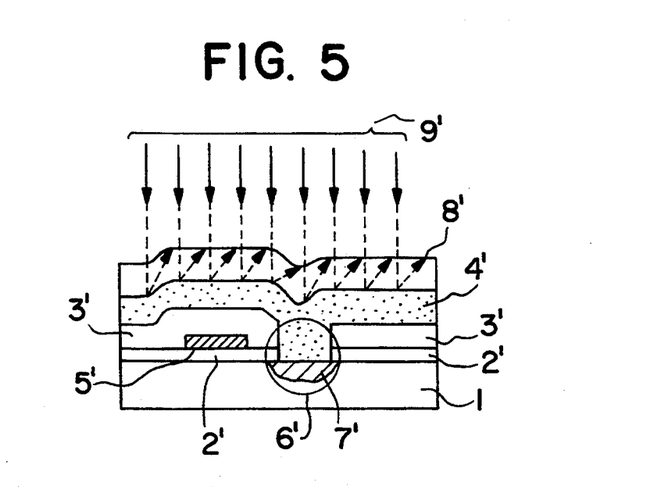
FIG. 5 is a diagrammatic cross sectional view of the semiconductor device of FIG. 4 showing the wiring layer being annealed in accordance with the present invention.

FIG. 5 is a cross sectional view of a semiconductor layer at the time of the process when the aluminum wiring layer is annealed by the laser beam.

First, a laser beam $9'$ irradiates the upper entire surface of the second silicon oxide film $8'$. The laser beam $9'$ may be generated from any conventional continuous wave or pulsed laser beam source and preferably from an excimer laser (not shown). Excimer lasers are lasers that utilize a rare gas such as Krypton, Zenon or Argon and a Halogen gas as the laser medium. When XeCl is used as a medium of the excimer laser, an oscillation wavelength of the excimer laser is short, i.e., 308 nm. The output of the laser beam $9'$ is substantially constant. A low energy density ranging from 0.3 to 0.5 (J/c$^2$) is preferred for use in accordance with the present invention.

The energy density of the laser beam $9'$ can be varied by adjusting the focal distance of an optical lens (not shown). In one embodiment of the present invention, the energy density of the laser beam $9'$ is set to approximately 0.5 (J/cm$^2$). Since the oscillation wavelength of the excimer laser is short, e.g., 308 nm for XeCl, the laser beam $9'$ does not pass through the silicon oxide film $8'$. The film thickness is preferably set to close to an integral multiple of the laser beam wavelength. The laser annealing operation is desirably conducted in a vacuum atmosphere at a preferred temperature range set to between 400° to 500° C.

There are two reasons why the atmosphere during annealing is preferably set at vacuum. The first is that absorption of light due to the laser medium in the atmosphere can be controlled. The second is that no impurity materials will be introduced at the time of recrystallization. There are also two reasons why the temperature of the atmosphere should desirably be set to a temperature of between 400° to 500° C. The first reason is attributable to use of a low energy density and the second to compensate against instability in the pulsed excimer laser beam $9'$. Increasing the temperature of the atmosphere tends to compensate for any unstableness in thermal energy.

The laser beam $9'$ is directly irradiated on the second silicon insulation film $8'$. If an excimer laser beam $9'$ is used, the laser beam is irradiated in pulses. The invention may also be practiced with a continuous wave laser source having an energy density within the range of between 0.3 to 0.5 J/cm$^2$. Most of the laser beam $9'$ will pass through the upper surface of the second silicon oxide film $8'$, but will be reflected from the boundary between the second silicon oxide film $8'$ and the aluminum wiring layer $4'$. Most of the reflected laser beam $9'$ is sequentially reflected within the second silicon film $8'$ between the upper surface and the boundary surface of the second silicon oxide film $8'$. The laser beam $9'$ is then repeatedly reflected inside of the second silicon oxide film $8'$. The irradiated pulses of the laser beams $9'$ interfere with each other in the inside of the silicon oxide film $8'$. As a result, the temperature of the silicon oxide film $8'$ is increased, and the aluminum wiring layer $4'$ is annealed.

Moreover, since the aluminum wiring layer $4'$ is coated with the second silicon insulating film $8'$, radiation heat is stored in the aluminum wiring layer $4'$. Thereby, the annealing effect of the aluminum wiring layer $4'$ can be improved.

On the other hand, the laser beam $9'$ is also irradiated on a portion of the second insulation film $8'$ which is not formed on the aluminum wiring layer $4'$. However, since the energy density of the laser beam $9'$ is low, i.e., ranging from 0.3 to 0.5 (J/cm$^2$), no unfavorable influence is exerted on the polycrystalline silicon wiring layer $5'$.

Moreover, if an optical lens is used whose focal distance is short the irradiation area of the laser beam may be extended at the time of annealing. As a result, it is possible to shorten the radiation time to more fully anneal the wiring layer.

Furthermore, after the annealing process, the second insulation film 8' can be used as a passivation film or an interlayer insulation film. Alternatively, the second insulation film 8' may be removed by dry-etching after the annealing process. In this case, the insulation film may be formed again by plasma CVD or CVD.

According to the present invention, no unfavorable influence is exerted on the semiconductor electrodes formed of polycrystalline silicon. In addition, deformation of the surface of the semiconductor substrate itself and any increase in contact resistance due to the use of a laser beam having high energy density can be prevented.

A second embodiment of the present invention will be explained with reference to FIGS. 6A to 8.

Figure 6A:
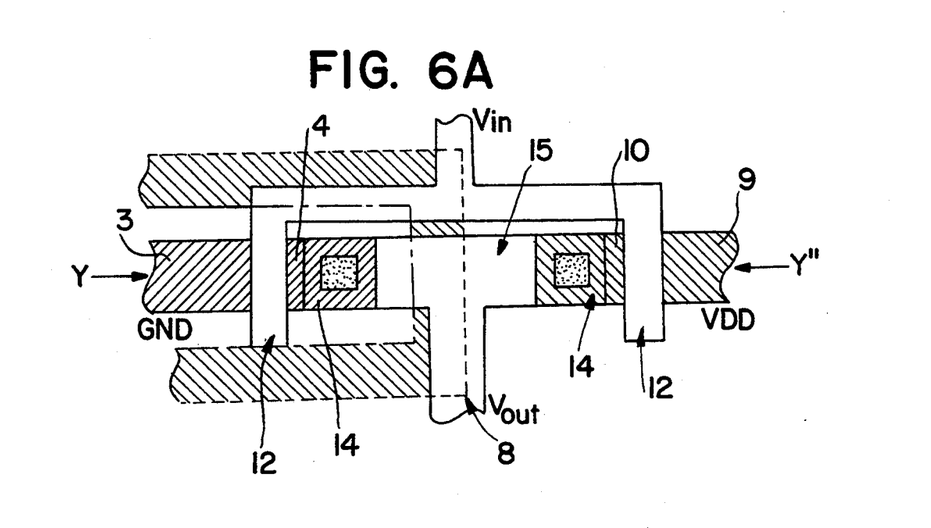
FIG. 6A is an upper surface view of a CMOS inverter for explaining another embodiment of the present invention.
Figure 6B:
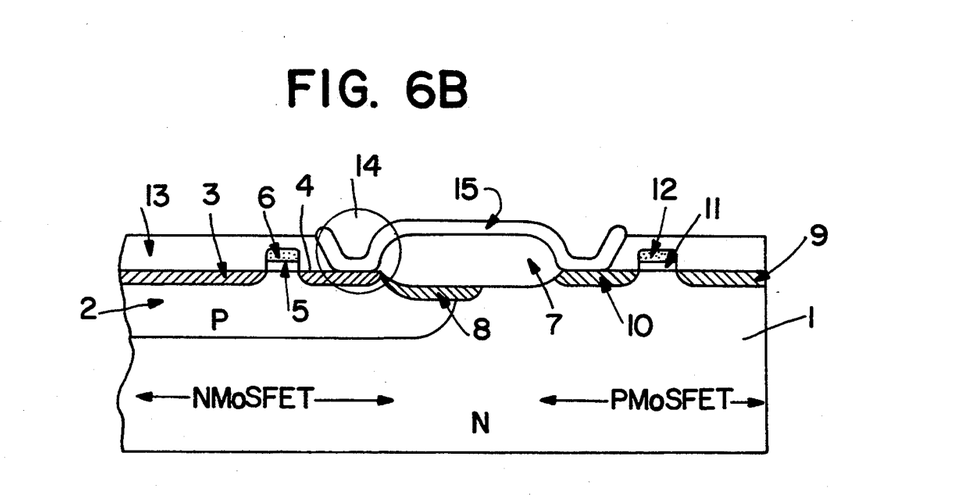
FIG. 6B is a cross sectional view taken along the line of Y—Y″ of FIG. 6A.

The semiconductor of the second embodiment is a CMOS inverter which includes an N MOSFET and a P MOSFET. The CMOS inverter is shown in FIGS. 6A and 6B. FIGS. 6B, 7B and 8 are cross sectional views taken along the line Y—Y" of the FIGS. 6A and 7A, respectively.

First, the structure of the N MOSFET and the manufacturing method will be explained. A P type well region 2 is formed on an N type semiconductor substrate 1. The P type well region 2 is formed by ion implantation. Also, the source region 3 and the drain region 4 are N+ type impurity diffusion regions. The source region 3 and the drain region 4 are formed by ion implantation. The gate insulation film 5 is formed on the semiconductor substrate 1. The gate insulation film 5 is a silicon oxide film. The gate insulation film 5 is formed by thermal oxidation. The gate electrode 6 is formed on the gate insulation film 5. The gate electrode 6 is formed of polycrystalline silicon, which is formed by CVD (chemical vapor deposition).

The P MOSFET is formed in the N type semiconductor substrate 1. The P MOSFET is isolated from the N MOSFET by the field oxide film 7. A P+ type source region 9 and the drain region 10 are formed. Also, the gate insulation film 11 and the gate electrode 12 are formed on the semiconductor substrate 1.

The first silicon oxide film 13 is formed on the entire surface by CVD. The gate electrode 12 is coated with the silicon oxide film 13. The contact hole 14 through which a part of the semiconductor substrate 1 is exposed is formed by dry-etching.

Thereafter, an aluminum wiring layer 15 is sequentially formed on the entire surface of the first silicon oxide film 13 by sputtering. The aluminum wiring layer 15 may be dry-etched using a mask to form a predetermined wiring pattern. The aluminum wiring layer 15 is electrically connected to the drain regions 4 and 10 through the contact hole 14.

Figure 7A:
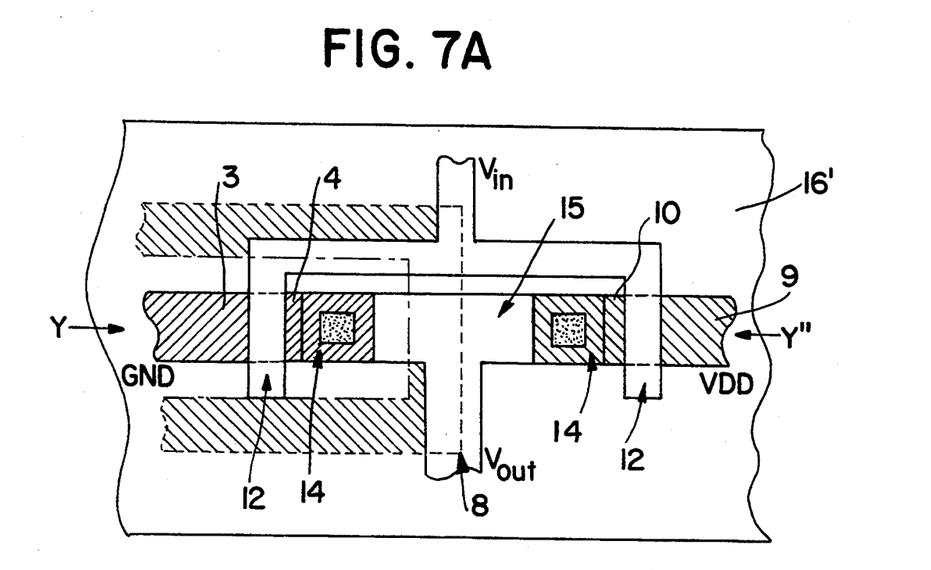
FIG. 7A is an upper surface view of a CMOS inverter for explaining the embodiment of the present invention.
Figure 7B:
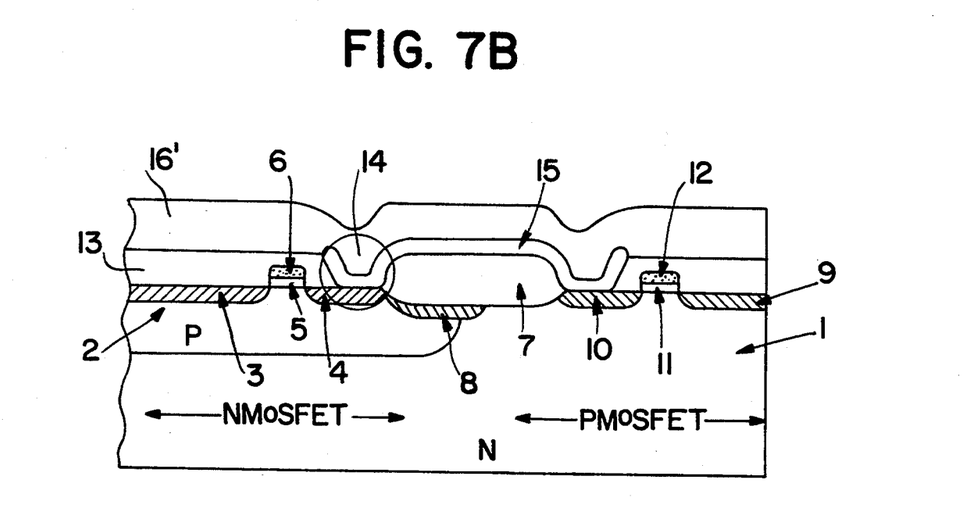
FIG. 7B is a cross sectional view taken along the line of Y—Y″ of FIG. 7A.
Figure 8:
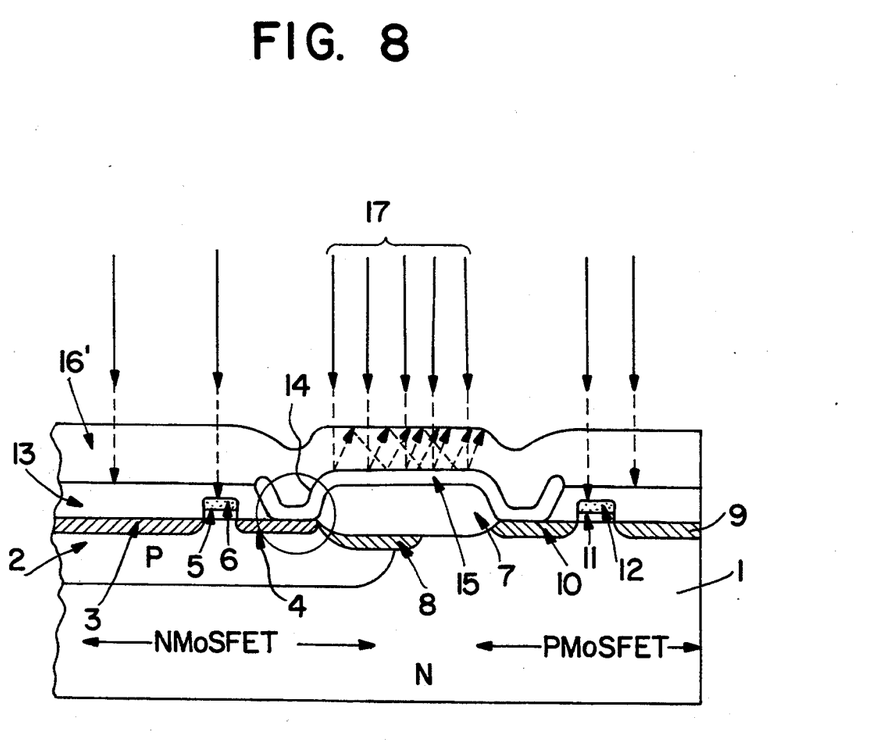
FIG. 8 is another cross sectional view of the CMOS inverter similar to FIG. 7B on which a laser beam is irradiated.

FIGS. 7A and 7B show the structure of the CMOS inverter in which a second silicon insulation film 16' is formed on the aluminum wiring layer 15 before the aluminum wiring layer is annealed.

The second silicon oxide layer 16' is formed on the entire surface of the semiconductor substrate 1 including the aluminum wiring layer 15. The second silicon insulation film 16' has a high permeability to the laser beam. The second silicon insulation film 16' is a silicon compound selected from the group consisting of silicon oxide, silicon nitride, a Boron Phosphorous Silicate Glass (BPSG), and a Phospo Silicate Glass (PSG).

The film thickness of the second silicon insulation film 16' is preferably set to close to an integral multiple of the wavelength of laser beam 17 as shown in FIG. 8. As an example, for a ArF excimer laser with a wavelength of 193 nm, the thickness of film 16' may be 5790° A (193 nm×3). Alternatively, for a XeCl excimer laser with a wavelength of 308 nm the film thickness may be 6160° A.

FIG. 8 is a cross sectional view of the CMOS inverter to show the state of the process when the aluminum wiring layer is annealed by the laser beam 17. The laser beam 17 is directly irradiated on the second silicon oxide film 16'. Most of the laser beam 17 is incident upon the inside of the second silicon film 16'. Thereafter, most of the laser beam 17 is reflected from the interface between the second silicon insulation film 16' and aluminum wiring layer 15. Most of the reflected laser beam 17 is sequentially reflected on the inner surface of the second silicon insulation film 16'. In this way, the laser beam 17 is repeatedly reflected within the inside of the second silicon insulation film 16'. As a result, the temperature of the second silicon insulating film 16 is increased, and the aluminum wiring layer 15 is fully annealed using only a low energy density laser beam 17.

According to the preferred embodiment of the present invention, the laser beam 17 is generated from an excimer laser. As a laser medium, XeCl, ArF, KrF are suitable. When XeCl is used as the laser medium, the oscillation wavelength is short, i.e., 308 nm. This inhibits the laser beam 17 from passing through the second silicon oxide film 16'. Also, the laser beam 17 is oscillated in a pulsed mode with a typical irradiation time per pulse of about 30 nsec. The high output level of the laser beam 17 is substantially constant. In this case, the irradiation area of the laser beam 17 per pulse is 1×1 to 10×10 mm². The energy density of the laser beam 17 can be controllably varied by adjusting the focal distance of an optical lens (not shown).

The energy density of the laser beam 17 should lie in a range from 0.3 to 0.5 (J/cm²) which is considerably lower than the laser beam energy density as conventionally practiced. The preferred irradiation time of the laser beam should lie in a range from 30 to 100 (ns). According to one embodiment of the present invention, the energy density of the laser beam 17 is set to 0.5 (J/cm²).

The energy density of the laser beam 17 is an important parameter of the present invention. The selection of the value of energy density between 0.3 to 0.5 J/cm² should be guided by the following three conditions:

The first condition is that the value of the energy density should not exert an unfavorable influence on the semiconductor electrode, which is formed of polycrystalline silicon. The second condition is that the value of the energy density should be sufficient to cause the metallic wiring layer to be elevated to a recrystallization temperature of (400° C.) or higher. The third condition is that the value of the energy density must be a value such that the temperature of the metallic wiring layer 15 is maintained below the melting point of the metallic wiring layer (660° C. for aluminum). The radiation time of the laser beam 17 should be adjusted to satisfactorily anneal the wiring layer.

The atmosphere during the annealing step is preferably set to vacuum so that the absorption of light due to the medium in the atmosphere can be controlled and to avoid introducing impurity materials at the time of recrystallization.

The laser beam 17 is preferably irradiated in pulses. The irradiating pulses will interfere with each other within the second insulation film 16'. If the film thickness of the second silicon insulation film 16' is set to a value close to an integral multiple of the wavelength of the laser beam, the interference of the pulses is maximized. This increases the residual energy in the second film 16' with more effective results.

Moreover, since the aluminum wiring layer 15 is coated with a second silicon oxide film 16' the heat radiation stored in the aluminum wiring layer 15 can be constrained. The annealing effect is thereby improved. Moreover, if the second silicon film is formed only on the aluminum wiring layer, then the gate electrode, which is formed of polycrystalline silicon, may be exposed to the laser beam during the annealing process but will not be unfavorably influenced since the energy density of the laser beam is low. Moreover, since the energy density of the laser beam is low at the time of annealing, the radiation area can be extended by use of an optical lens whose focal distance is short. As a result, it is possible to shorten the irradiation time of the laser beam at the time of annealing. Furthermore, after the annealing process, the second insulation film 16' may be used as a passivation film or an interlayer insulation film. As a result, the number of processes can be reduced.

What is claimed:

1. A method of manufacturing a semiconductor device, comprising the steps of:
   a) forming a first insulation layer on a semiconductor substrate;
   b) forming a metal wiring layer on a part of the first insulation layer and a polycrystalline silicon layer on another part of the first insulation layer;
   c) forming a second insulation layer at least on the metal wiring layer; and
   d) irradiating said second insulation layer with a laser beam of low energy density, wherein the laser beam is reflected in the second insulation layer and has a first value of energy density such that the temperature of the metal wiring layer is increased up to at least the recrystallization temperature or more, and a second value of energy density by which the temperature of the metal wiring layer is less than its melting point, thus annealing the metal wiring layer without melting the polycrystalline silicon layer.

2. The method of manufacturing a semiconductor device according to claim 1, wherein the metal wiring layer is aluminum.

3. The method of manufacturing a semiconductor device according to claim 1, wherein the second insulation layer is selected from the group consisting of Silicon oxide, Silicon nitride, Boron Phosphorous, Silicate Glass, and Phospho Silicate Glass.

4. The method of manufacturing a semiconductor device according to claim 1, wherein said laser is a pulsed excimer laser.

5. A method of manufacturing a semiconductor device, comprising the steps of:
   a) forming a first insulation layer on a semiconductor substrate;
   b) forming a metal wiring layer on a part of the first insulation layer and a polycrystalline silicon layer on another part of the first insulation layer;
   c) forming a second insulation layer at least on the metal wiring layer; and
   d) irradiating said second insulation layer with a laser beam having an energy density of 0.3–0.5 $J/cm^2$ which is reflected within the second insulation layer, thus annealing the metal wiring layer without melting the polycrystalline silicon layer.

6. A method as defined in claim 5, wherein the metal wiring layer is aluminum.

7. A method as defined in claim 5, wherein said second insulation layer is selected from the group consisting of Silicon oxide, Silicon nitride, Boron Phosphorous, Silicate Glass, and Phospho Silicate Glass.

8. A method as defined in claim 5, wherein said laser is a pulsed excimer laser.

9. A method as defined in claim 8, wherein the excimer laser medium is selected from the class consisting of XeCl, ArF and KrF.

10. A method as defined in claim 7, wherein said second insulation layer has a thickness which substantially conforms to an integral multiple of the wavelength of said excimer laser.

11. In a MOS semiconductor device having a semiconductor substrate containing P and N type impurity diffusion regions, a first insulation layer on said substrate, a metal wiring layer on a part of said first insulation layer in contact with at least one of said impurity diffusion regions, a polycrystalline silicon layer on another part of the first insulation layer and a second insulation layer over at least said metal wiring layer, wherein said metal wiring layer is annealed by means of a low energy density laser beam.

12. In a MOS semiconductor device as claimed in claim 11, wherein said laser beam has a first value of energy density such that the temperature of the metal wiring layer is increased up to at least the recrystallization temperature or more, and a second value of energy density by which the temperature of the metal wiring layer is less than its melting point.

13. In a MOS semiconductor device as claimed in claim 11, wherein said laser beam has an energy density of 0.3–0.5 $J/cm^2$.

14. In a MOS semiconductor device as claimed in claim 11, wherein said second insulation layer has a thickness substantially equal to an integral multiple of said laser beam.

* * * * *